United States Patent [19]
Lee et al.

[11] Patent Number: 6,007,953
[45] Date of Patent: Dec. 28, 1999

[54] METHOD OF AVOIDING PEELING ON WAFER EDGE AND MARK NUMBER

[75] Inventors: Tzung-Han Lee, Taipei; Chi-Fa Ku, Hsinchu Hsien; Army Chung, Hsinchu; Chien-Li Kuo, Hsinchu Hsien, all of Taiwan

[73] Assignee: United Microelectronics Corp., Hsinchu, Taiwan

[21] Appl. No.: 09/098,249

[22] Filed: Jun. 16, 1998

[30] Foreign Application Priority Data

Apr. 27, 1998 [TW] Taiwan ................................. 87106430

[51] Int. Cl.$^6$ ....................................................... G03F 9/00
[52] U.S. Cl. .................................................................. 430/30
[58] Field of Search .................................................. 430/30

*Primary Examiner*—Christopher G. Young

[57] ABSTRACT

The invention provides a method of avoiding peeling on the wafer edge and the mark number. The method uses a design rule to expose the multi-layer on a wafer. The limit and the scope of the exposed distance are taken to ensure the polysilicon layers and the metal layers are covered by the dielectric layer after exposure. The polysilicon layers or the metal layers don't unclothe from the overlarge distance at the exposed dielectric layer, so the next structure formed on the exposed dielectric layer doesn't peeling from contacting with the polysilicon layer or the metal layer. The invention avoids to contaminate the wafer and the machine after the particles forming from peeling.

10 Claims, 3 Drawing Sheets

6,007,953

METHOD OF AVOIDING PEELING ON WAFER EDGE AND MARK NUMBER

CROSS-REFERENCE TO RELATED APPLICATION

This application claims the priority benefit of Taiwan application serial no. 87106430, filed Apr. 27, 1998, the full disclosure of which is incorporated herein by reference.

BACKGROUND OF THE INVENTION

1. Field of the Invention

The invention relates in general to the fabrication of semiconductor integrated circuits (ICs), and more particularly to a method of forming metal layers and other layers and avoiding peeling in the back-ending process to form semiconductor devices.

2. Description of the Related Art

When semiconductor integrated circuits are fabricated, several methods are used to form multi-layer structures to offer different functions such as conductor layer, dielectric layer, insulating layer or adhesion layer. The structures use various materials to make the device achieve the best efficiency. In present semiconductor industry, tungsten silicide has those advantages of high melting point, high stability and low resistance. It is mostly used to enhance the ohmic contact between polysilicon layers and used as partial metal layer of a gate in the metal oxide semiconductor (MOS).

A dielectric layer is provided between a tungsten silicide layer and a metal layer during the back-ending process to form a tungsten silicide layer. It is easy to find the tungsten silicide layer and the metal layer contacting directly and peeling in the wafer edge and the mark number section which is used to distinguish a wafer. A titanium/titanium nitride layer is usually formed on the oxide layer to enhance the metal adhesion of the oxide layer before forming the metal layer. The titanium nitride layer has a bad adhesion of the polysilicon layer and the tungsten silicide layer. When they touch each other directly, they peel and form particles. The particles contaminate the devices and the holo-machine and affect the process.

FIG. 1 is a cross-sectional view of a tungsten silicide layer contacting with a metal layer. A conductive layer 102 and an oxide layer 104 are formed on a semiconductor device 100. A titanium/titanium nitride layer 106 and a metal layer 108 are formed on the oxide layer 104. The oxide layer 104 may not completely cover the conductive layer 102 at the edge of the semiconductor device 100. That makes a region 100 nearing the wafer edge of the conductive layer 102 contacting with the titanium/titanium nitride layer 106 and metal layer 108. Since the adhesion between etch layer is poor, the metal layer 108 or the titanium/titanium nitride layer may peel and form particles to contaminate the process and the machine. This phenomenon doesn't only happen at the wafer edge but also at the mark number used to distinguish the wafer.

SUMMARY OF THE INVENTION

It is therefore the object of the invention to provide a method of avoiding peeling on the wafer edge and the mark number. The area and the limit of forming the oxide layer and the polysilicon layer are taken to insure the oxide layer can cover all the polysilicon layer at the wafer edge and the mark number, and avoid the polysilicon layer contacting with the titanium nitride layer or the metal layer.

The invention achieves the above-identified objects by providing a new method of avoiding peeling on the wafer edge and the mark number. The area used of the wafer is subtracted and the residual area is taken. A design rule is guarded and the limit of the distance in which a polysilicon layer, a metal layer or a titanium nitride layer is exposed is computed. If a structure is polysilicon or metal, the structure must be exposed at the wafer edge and the mark number. If the structure is dielectric, the structure must be exposed at the wafer edge and not exposed at the mark number. Furthermore, the dielectric layer must cover the polysilicon layer or the metal layer forming in the forgoing step to separate from the metal layer or the polysilicon layer forming in the follow-up step.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
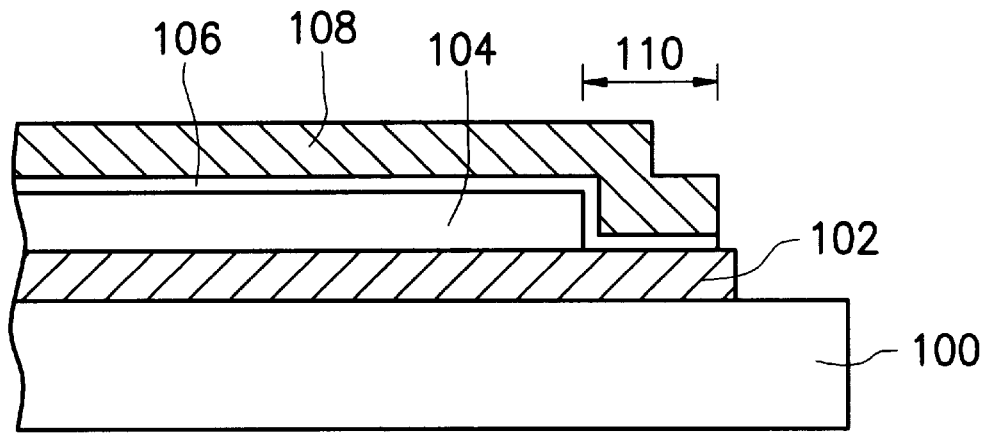
FIG. 1 is a cross-sectional view showing a conventional structure that a tungsten silicide layer contacts with a metal layer.
Figure 2A:
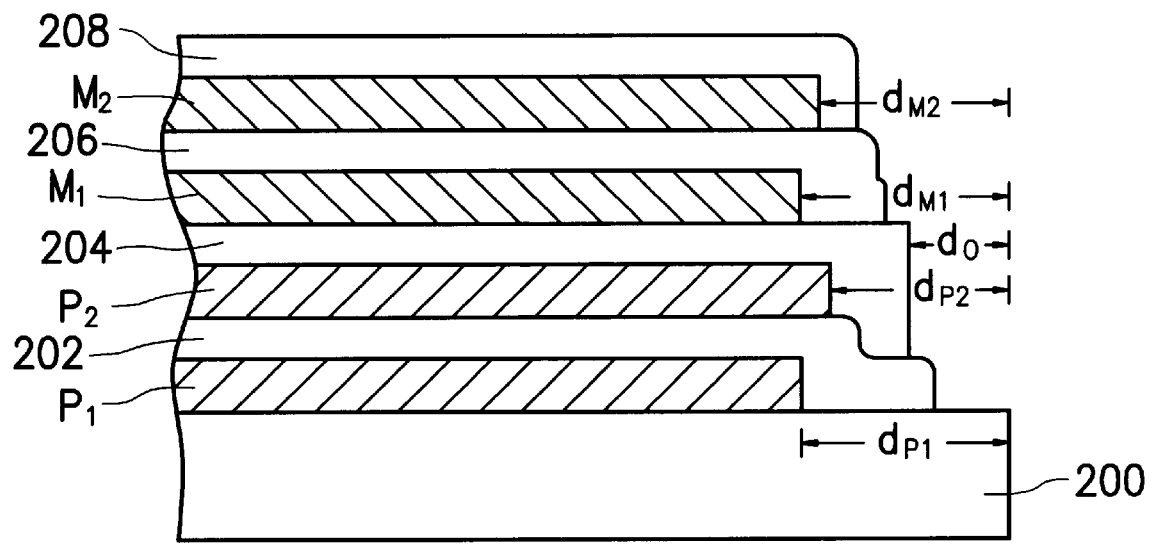
FIG. 2A and FIG. 2B are cross-sectional views showing the structure of one preferred embodiment of the method of avoiding peeling on the wafer edge and the mark number.
Figure 2B:
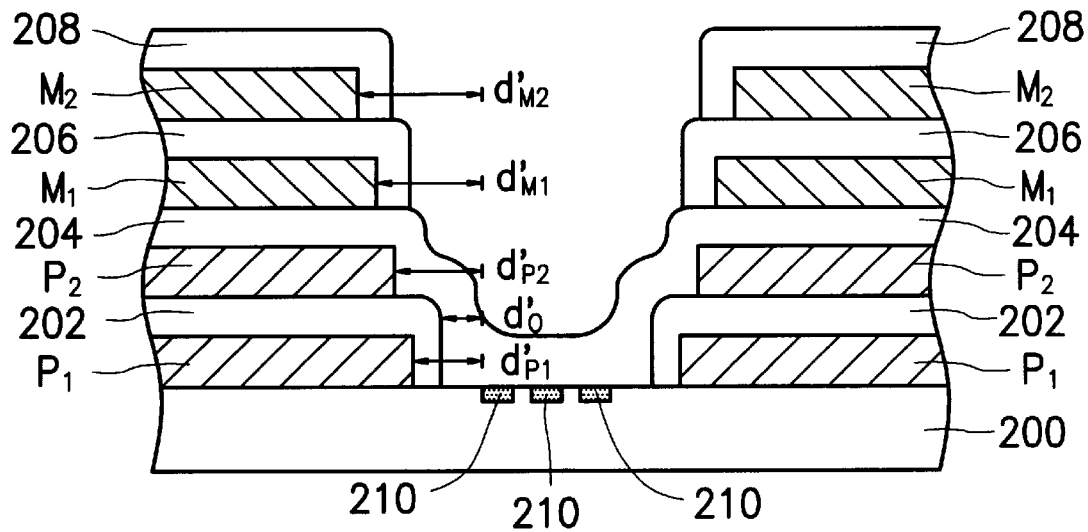

Referring to FIG. 2A and FIG. 2B, a first polysilicon layer $P_1$, a inter-poly dielectric layer (IPD) 202, a second polysilicon layer $P_2$, a inter-layer dielectric layer (ILD) 204, a first metal layer $M_1$, a first inter-metal dielectric layer (IMD) 206, a second metal layer $M_2$ and a second IMD layer 208 are sequentially forming on a wafer 200. The first polysilicon layer $P_1$ and the second polysilicon layer $P_2$ respectively have a tungsten nitride layer (not shown) formed above them to enhance the ohmic contact of the polysilicon layers. The first metal layer $M_1$ and the second metal layer $M_2$ respectively include a main metal layer and a titanium/titanium nitride layer. The titanium/titanium nitride layer is used to enhance the adhesion of the metal layer to the dielectric layer. The material of the metal layers is oxide.

As shown in FIG. 2A, the distance between the first polysilicon layer $P_1$ and the wafer edge 200 is $d_{P1}$. The distance between the second polysilicon layer $P_2$ and the wafer edge 200 is $d_{P2}$. The distance between the first metal layer $M_1$ and the wafer edge 200 is $d_{M1}$. The distance between the second metal layer $M_2$ and the wafer edge 200 is $d_{M2}$. The distance between the IMD layer 204 and the wafer edge 200 is $d_O$. The IMD layer 204 must cover all the first polysilicon layer $P_1$ and all the second polysilicon layer $P_2$ at the wafer edge 200 for avoiding the titanium/titanium nitride layers in the metal layers $M_1$ and $M_2$ contacting with the polysilicon layers and the tungsten layers on the polysilicon layers. Therefore, $d_M \geq d_O$, $d_P \geq d_O$, $d_{M1} \geq d_{M2}$, and $d_{P1} \geq d_{P2}$.

Furthermore, every wafer is marked with number for distinguishing, so the mark number of the wafer can not be blanketed. Part of the metal layers and the polysilicon layers at the number mark must be removed. The peeling from the metal layers contacting with the polysilicon layers may fall out at the number mark.

As shown in FIG. 2B, The wafer 200 has a number mark 210. The distance between the first polysilicon layer $P_1$ and the number mark 210 is $d'_{P1}$. The distance between the second polysilicon layer $P_2$ and the number mark 210 is $d'_{P2}$. The distance between the first metal layer $M_1$ and the number mark 210 is $d'_{M1}$. The distance between the second metal layer $M_2$ and the number mark 210 is $d'_{M2}$. The distance between the IPD layer 202 and the number mark 210 is $d'_O$. The distance from etch layer to the mark number 210 must follow the design rule that $d'_M \geq d'_O$, $d'_P \geq d'_O$, $d'_{M2} \geq d'_{M1}$, and $d'_{P2} \geq d'_{P1}$ for avoiding to cover the mark number 210.

When the multi-layer structure is formed and patterned, the design rules described above are consulted to insure the metal layers and the polysilicon layers are completely covered by dielectric layers and don't peel from contacting.

Figure 3:
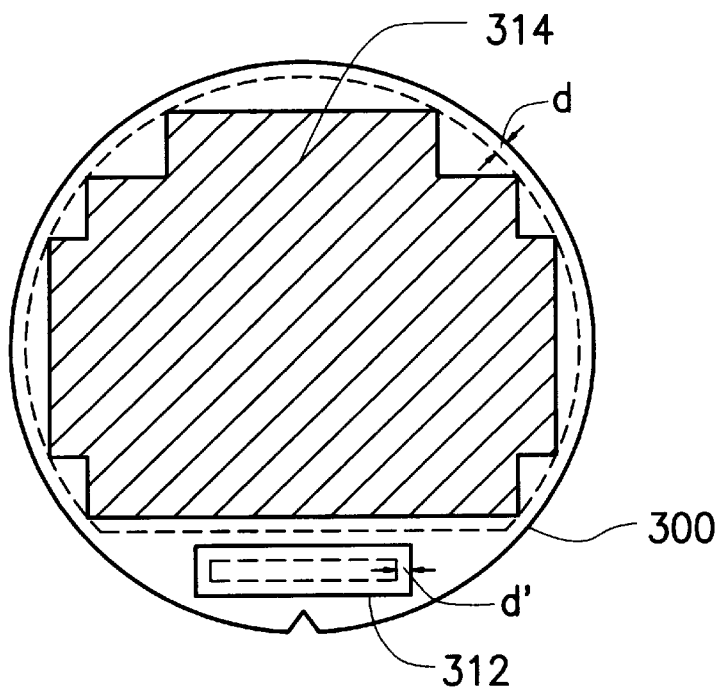
FIG. 3 is a top view showing the structure of one preferred embodiment of the method of avoiding peeling on the wafer edge and the mark number.
Figure 4:
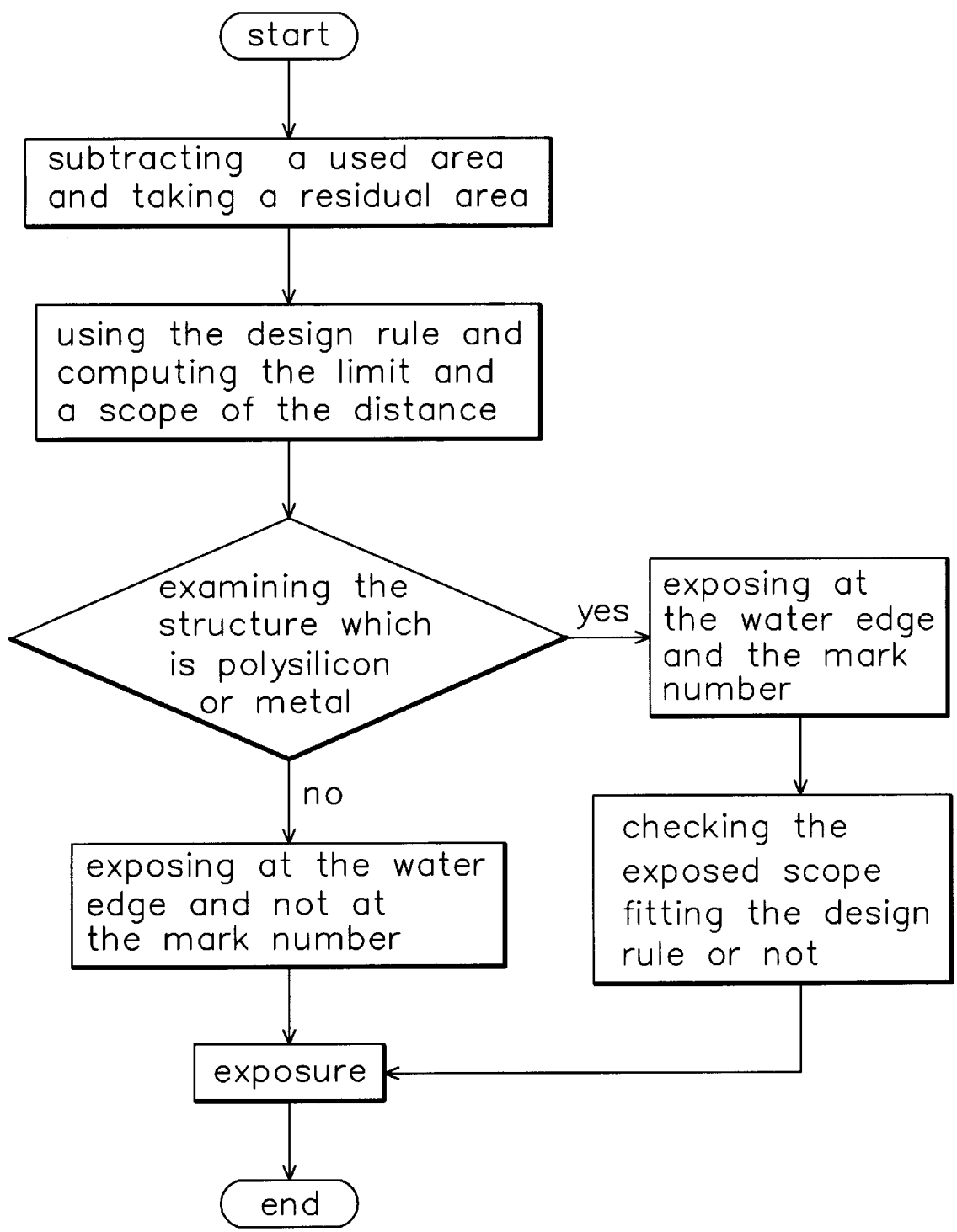
FIG. 4 is a flow diagram showing the process steps of one preferred embodiment of the method of avoiding peeling on the wafer edge and the mark number.

Referring to FIG. 3 and FIG. 4, first the used area of the total area of the wafer 200 is subtracted and the residual area is taken. The design rule is incorporated to take the limit and the scope of the wafer edge and the mark number. A structure where an photolithography step is performed is examined either a polysilicon layer or a metal layer. If the structure is a polysilicon layer or a metal layer, the polysilicon layer or the metal layer must be exposed at the wafer edge and the mark number and the exposed distance must be same or larger than the next structure whose material is same. If the structure is a dielectric layer, the dielectric layer must be exposed at the wafer edge and the exposed distance must be same or smaller than the next structure whose material is dielectric. It means that the dielectric layer must blanket the polysilicon layers and the metal layers. A development step is performed when the exposed distance is insured.

The invention provides a method of avoiding peeling on the wafer edge and the mark number. The method uses a design rule to expose every structure. The limit and the scope of the exposed distance are taken to insure the polysilicon layers and the metal layers are covered by the dielectric layer after exposure. The polysilicon layers or the metal layers don't unclothe from the overlarge distance at the exposed dielectric layer, so the next structure formed on the exposed dielectric layer doesn't peeling from contacting with the polysilicon layer or the metal layer.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of avoiding peeling on a wafer edge and a mark number of a wafer, the method comprising the steps of:
   determining a used area and a residual area of the wafer;
   computing a distance between an edge of a structure formed on the wafer and the wafer edge and the mark number;
   examining the structure where a photolithography step is carried on;
   exposing the structure at the wafer edge and the mark number if the structure is a polysilicon layer or a metal layer;
   exposing the structure at the wafer edge if the structure is a dielectric layer; and
   performing an exposure step.

2. A method according to claim 1, wherein the structure is a polysilicon layer or a metal layer or a dielectric layer.

3. A method according to claim 2, wherein the dielectric layer is a oxide layer.

4. A method according to claim 2, wherein the polysilicon layer comprises a tungsten layer.

5. A method according to claim 2, wherein the metal layer comprises a titanium/titanium nitride layer.

6. A method of avoiding peeling on a wafer edge and a mark number of a wafer, wherein the method is used to check an exposed region and a scope of a structure on the wafer in a photolithography step, the method comprising:
   subtracting a used area of the wafer and taking a residual area of the wafer;
   computing distances between an edge of the structure on the wafer and the wafer edge and the mark number;
   examining the material of the structure on the wafer which is one of a polysilicon layer, a metal layer or a dielectric layer where a photolithography step is carried on the structure;
   ensuring the structure is exposed at the wafer edge and the mark number if the structure is the polysilicon layer or the metal layer;
   ensuring the structure is exposed at the wafer edge if the structure is the dielectric layer; and
   performing an exposure step.

7. A method according to claim 6, wherein the dielectric layer is a oxide layer.

8. A method according to claim 6, wherein the polysilicon layer comprises a tungsten layer.

9. A method according to claim 6, wherein the metal layer comprises a titanium/titanium nitride layer.

10. A method of avoiding peeling on a wafer edge and a mark number of a wafer, wherein the method is used to check an exposed region and a scope of a structure on the wafer in a photolithography step, the method comprising:
   subtracting a used area of the wafer and taking a residual area of the wafer;
   forming a polysilicon layer on the wafer;
   computing a first distance between an edge of the polysilicon layer and the wafer edge;
   ensuring the polysilicon layer is exposed at the wafer edge and the mark number;
   performing a first exposure step;
   forming an inter-layer dielectric layer on the polysilicon layer;
   computing a second distance between an edge of the dielectric layer and the wafer edge;
   ensuring the inter-layer dielectric layer is exposed at the wafer edge and isn't exposed at the mark number;
   performing a second exposure step;
   forming a metal layer on the inter-layer dielectric layer;
   computing a third distance between an edge of the metal layer and the wafer edge;
   ensuring the metal layer is exposed at the wafer edge and the mark number; and
   performing a third exposure step.

* * * * *